(12) United States Patent
Tanimoto et al.

(10) Patent No.: US 12,306,235 B2
(45) Date of Patent: *May 20, 2025

(54) ELECTROMAGNETIC WAVE VISUALIZATION DEVICE

(71) Applicant: Panasonic Intellectual Property Management Co., Ltd., Osaka (JP)

(72) Inventors: Shinichi Tanimoto, Kyoto (JP); Ryo Matsubara, Osaka (JP); Shinkuro Fujino, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 682 days.

This patent is subject to a terminal disclaimer.

(21) Appl. No.: 17/631,760

(22) PCT Filed: Jul. 14, 2020

(86) PCT No.: PCT/JP2020/027377
§ 371 (c)(1),
(2) Date: Jan. 31, 2022

(87) PCT Pub. No.: WO2021/020110
PCT Pub. Date: Feb. 4, 2021

(65) Prior Publication Data
US 2022/0276294 A1    Sep. 1, 2022

(30) Foreign Application Priority Data

Aug. 1, 2019  (JP) ................. 2019-142608

(51) Int. Cl.
*G01R 29/08*  (2006.01)
(52) U.S. Cl.
CPC ..... *G01R 29/0892* (2013.01); *G01R 29/0878* (2013.01)

(58) Field of Classification Search
CPC ............ G01R 29/0878; G01R 29/0892
(Continued)

(56) References Cited

U.S. PATENT DOCUMENTS

| 5,533,388 A | 7/1996 | Yamamoto et al. |
| 11,953,536 B2 * | 4/2024 | Tanimoto ........... G01R 29/0892 |

(Continued)

FOREIGN PATENT DOCUMENTS

| JP | H07-260853 A | 10/1995 |
| JP | 2000-147034 A | 5/2000 |

(Continued)

OTHER PUBLICATIONS

U.S. Appl. No. 17/632,162 to Shinichi Tanimoto et al., filed Feb. 1, 2022.

(Continued)

*Primary Examiner* — Aditya S Bhat
(74) *Attorney, Agent, or Firm* — GREENBLUM & BERNSTEIN, P.L.C.

(57) ABSTRACT

An electromagnetic wave visualization device includes an image acquisition unit that captures an image of a target device, a measurement unit that measures an electromagnetic wave intensity of the target device, a controller that generates a composite image in which a measurement result of the electromagnetic wave intensity measured by the measurement unit is superimposed on the captured image of the target device acquired by the image acquisition unit, an output unit that outputs the composite image, and a distance measuring unit that measures a distance from the measurement unit to the target device. The controller determines, whether or not the distance measured by the distance measuring unit is within a predetermined distance at which the electromagnetic wave intensity in the frequency bandwidth is measurable, generates an alert in a case where the distance (Continued)

is not within the predetermined distance, and causes the output unit to output the alert.

10 Claims, 7 Drawing Sheets

(58) Field of Classification Search
USPC .......................................................... 702/66
See application file for complete search history.

(56) References Cited

U.S. PATENT DOCUMENTS

| | | | |
|---|---|---|---|
| 2007/0024293 | A1 | 2/2007 | Kosaka et al. |
| 2011/0227775 | A1 | 9/2011 | Hirose et al. |
| 2012/0019858 | A1* | 1/2012 | Sato ................... H04N 1/00344 358/1.15 |
| 2013/0045008 | A1 | 2/2013 | Miyazaki et al. |
| 2017/0180065 | A1 | 6/2017 | Tsukamoto |
| 2019/0114810 | A1* | 4/2019 | Tokuchi .................. G06T 11/60 |
| 2023/0015021 | A1* | 1/2023 | Nomura .................. G06F 30/12 |
| 2023/0213747 | A1* | 7/2023 | Horisaki ................ G01N 15/14 356/338 |

FOREIGN PATENT DOCUMENTS

| | | |
|---|---|---|
| JP | 2003-110278 A | 4/2003 |
| JP | 2007-017250 A | 1/2007 |
| JP | 2010-096658 A | 4/2010 |
| JP | 2011-053055 A | 3/2011 |
| JP | 2011-174709 A | 9/2011 |
| JP | 2012-028373 A | 2/2012 |
| JP | 2016-188798 A | 11/2016 |
| JP | 2016-217882 A | 12/2016 |
| JP | 2017-096901 A | 6/2017 |
| WO | 2009/128377 A1 | 10/2009 |
| WO | 2016/013190 A1 | 1/2016 |

OTHER PUBLICATIONS

International Search Report issued in International Bureau of WIPO Patent Application No. PCT/JP2020/027377, dated Sep. 29, 2020, along with an English translation thereof.

* cited by examiner

ELECTROMAGNETIC WAVE VISUALIZATION DEVICE

CROSS-REFERENCE TO RELATED APPLICATIONS

The present application is a National Stage Application of PCT/JP2020/027377, filed on Jul. 14, 2020, which claims priority to Japanese Patent Application number 2019-142608, filed on Aug. 1, 2019.

TECHNICAL FIELD

The present disclosure relates to an electromagnetic wave visualization device.

BACKGROUND ART

PTL 1 discloses an electromagnetic wave measurement method for an electronic device of receiving electromagnetic wave components and measuring unnecessary electromagnetic wave components while sequentially scanning a reception region by pointing a directional antenna probe of which a reception region is widened according to a measurement distance to an object to be measured. In this electromagnetic wave measurement method, a plurality of long and short measurement distances from the object to be measured are set, measurement at a long measurement distance to measurement at a short measurement distance are performed a plurality of times, and the measurement at the short measurement distance is performed on a reception region where unnecessary electromagnetic wave components have been measured at the long measurement distance.

CITATION LIST

Patent Literature

PTL 1: Japanese Patent Unexamined Publication No. 2007-17250

SUMMARY OF THE INVENTION

The present disclosure has been devised in view of the above circumstances of the related art, and an object of the present disclosure is to provide an electromagnetic wave visualization device that easily visualizes the intensity of an electromagnetic wave generated during an operation of a target device.

According to the present disclosure, there is provided an electromagnetic wave visualization device including an image acquisition unit that captures an image of a target device; a measurement unit that measures an electromagnetic wave intensity of the target device; a controller that generates a composite image in which a measurement result of the electromagnetic wave intensity measured by the measurement unit is superimposed on the captured image of the target device acquired by the image acquisition unit; an output unit that outputs the composite image generated by the controller; and a distance measuring unit that measures a distance from the measurement unit to the target device, in which the controller determines, on the basis of a frequency bandwidth that is measurable by the measurement unit, whether or not the distance measured by the distance measuring unit is within a predetermined distance at which the electromagnetic wave intensity in the frequency bandwidth is measurable, generates an alert in a case where the distance is not within the predetermined distance, and causes the output unit to output the alert.

According to the present disclosure, there is provided an electromagnetic wave visualization device including a camera that captures an image of a target device; a measurement unit that measures an electromagnetic wave intensity of the target device; a controller that generates a composite image in which a measurement result of the electromagnetic wave intensity measured by the measurement unit is superimposed on the captured image of the target device acquired by the camera; a monitor that displays the composite image generated by the controller; and a distance measuring unit that measures a distance from the measurement unit to the target device, in which the controller determines, on the basis of a frequency bandwidth that is measurable by the measurement unit, whether or not the distance measured by the distance measuring unit is within a predetermined distance at which the electromagnetic wave intensity in the frequency bandwidth is measurable, generates an alert in a case where the distance is not within the predetermined distance, and causes the monitor to output the alert.

According to the present disclosure, an intensity of an electromagnetic wave generated during an operation of the target device can be easily visualized.

DESCRIPTION OF EMBODIMENT

Figure 1:
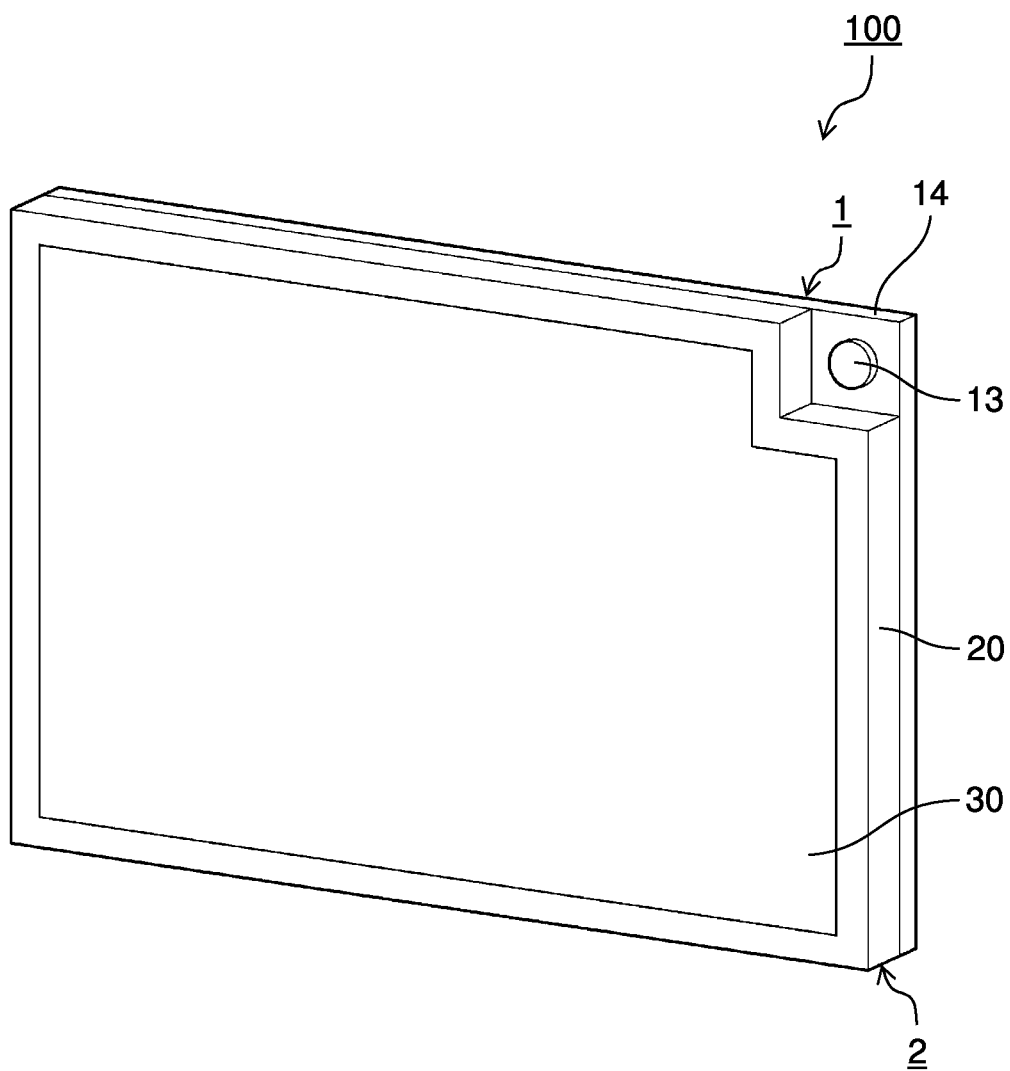
FIG. 1 is an appearance diagram illustrating an example of an electromagnetic wave visualization device according to Exemplary Embodiment 1.

Background of Details of Exemplary Embodiment 1

PTL 1 discloses an electromagnetic wave measurement method of measuring unnecessary electromagnetic wave intensity by using a directional antenna probe of which a reception region is widened according to a measurement distance to an electronic device that is a target device. In this electromagnetic wave measurement method, each of a plurality of different measurement distances from the target device is set, an electromagnetic wave intensity is measured at the set long measurement distance, and as a result, an electromagnetic wave intensity at a short measurement distance is measured for a reception region where an unnecessary electromagnetic wave intensity has been measured. However, in the above electromagnetic wave measurement method, a reception region where an electromagnetic wave can be received by the antenna probe used is restricted. Therefore, in the above electromagnetic wave measurement method, a region where unnecessary electromagnetic wave is generated is specified by measuring an electromagnetic wave intensity of the entire target device once at a long measurement distance, and the electromagnetic wave intensity is again measured at a short measurement distance for the specified region. Thus, it takes time to specify a generation source of the unnecessary electromagnetic wave.

There is also an electromagnetic compatibility (EMC) standard indicating that a device or a system functions in its electromagnetic environment without causing unacceptable interference to anything else in the environment in which the device or the system is installed. The EMC standard includes an electromagnetic interference (EMI) standard indicating that an electromagnetic wave (noise) is generated and does not adversely affect other devices, and an electromagnetic susceptibility (EMS) standard indicating the resistance to effects of external noise (electromagnetic wave) generated from other devices or the like, and various tests according to products are defined.

The various tests described above are performed in an anechoic chamber (test room) that is not affected by the surrounding radio wave environment and that corresponds to details of the various tests. Therefore, since a user uses an anechoic chamber that is used in the EMC standard when measuring the electromagnetic wave intensity of a target device and is not affected by the surrounding radio wave environment, it is difficult for the user to easily measure the electromagnetic wave intensity in various places other than the anechoic chamber. Therefore, it is difficult for the user to measure the electromagnetic wave intensity at a measurement distance desired by the user and measure the electromagnetic wave intensity in a specific environment (for example, an environment in which the target device is actually used or an environment in which the target device to which a predetermined load is applied). Thus, it becomes difficult for the user to specify a generation source (generation location) of an electromagnetic wave, for example, in a case where a measurement distance is long (in other words, an antenna is located far from the target device) with respect to the characteristics of the antenna to be used, and also to efficiently take measures against electromagnetic waves according to a usage environment.

On the other hand, as a method of measuring the electromagnetic wave intensity without using an anechoic chamber, there is a method of measuring a near magnetic field by using a planar probe array. In such a measurement method, in a case where a target device is a board in a personal computer (PC), it is necessary to take out the board that can be a generation source of an electromagnetic wave from a housing of the PC, and thus it is difficult to measure the intensity of an electromagnetic wave generated in the actual usage environment of the PC.

Therefore, in the exemplary embodiment described below, an example of an electromagnetic wave visualization device that easily visualizes the intensity of an electromagnetic wave generated during an operation of a target device will be described.

Hereinafter, exemplary embodiments in which a configuration and an operation of the electromagnetic wave visualization device according to the present disclosure are specifically disclosed will be described in detail with reference to the drawings as appropriate. However, more detailed description than necessary may be omitted. For example, detailed description of already well-known matters and repeated description of substantially the same configuration may be omitted. This is to avoid unnecessary redundancy of the following description and to facilitate the understanding of those skilled in the art. The accompanying drawings and the following description are provided for those skilled in the art to fully understand the present disclosure, and are not intended to limit the subject matter described in the claims.

Exemplary Embodiment 1

Figure 2:
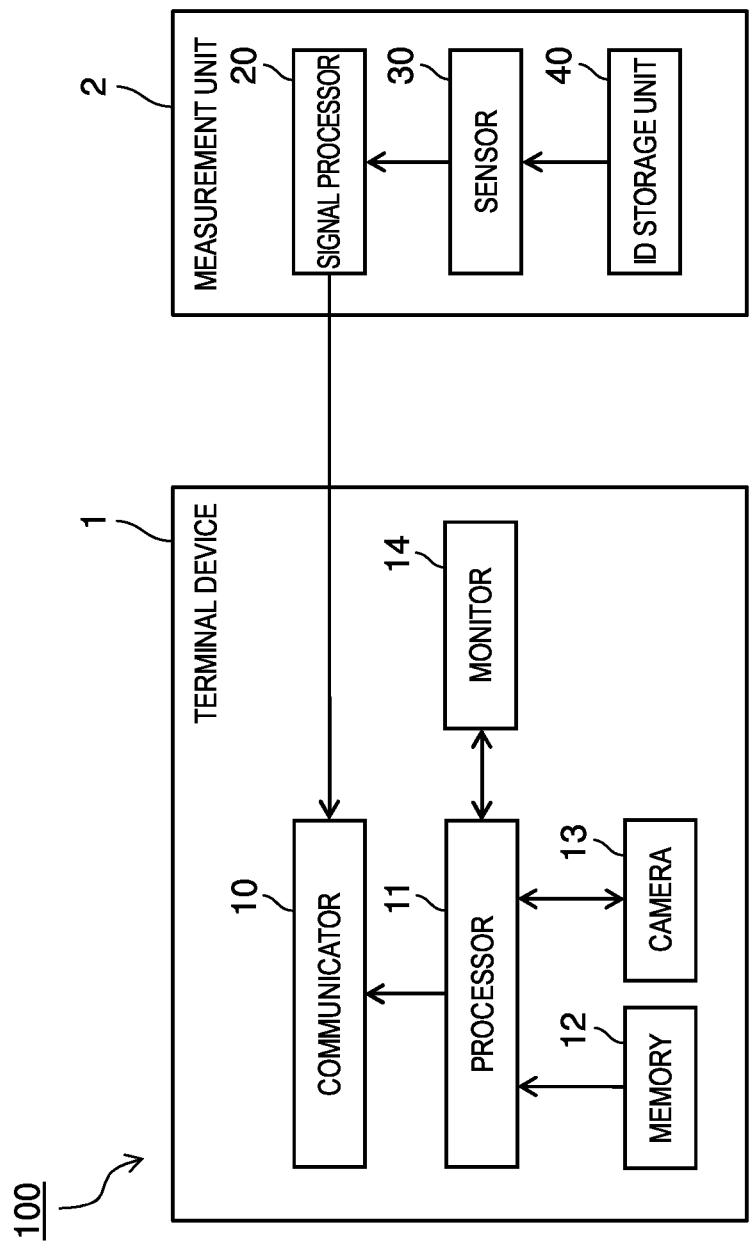
FIG. 2 is a diagram illustrating an internal configuration example of the electromagnetic wave visualization device according to Exemplary Embodiment 1.

First, electromagnetic wave visualization device 100 according to Exemplary Embodiment 1 will be described with reference to FIGS. 1 and 2. FIG. 1 is an appearance diagram illustrating an example of electromagnetic wave visualization device 100 according to Exemplary Embodiment 1. FIG. 2 is a diagram illustrating an internal configuration example of electromagnetic wave visualization device 100 according to Exemplary Embodiment 1. Electromagnetic wave visualization device 100 according to Exemplary Embodiment 1 is, for example, a portable device that is grasped by a user and measures an electromagnetic wave intensity of target device Tg1 that is an electromagnetic wave measurement target. Electromagnetic wave visualization device 100 includes terminal device 1 and measurement unit 2.

Terminal device 1 is a portable device such as a so-called tablet PC or smartphone. Terminal device 1 generates a heat map image based on the electromagnetic wave intensity of target device Tg1 received by measurement unit 2 that will be described later, further generates a composite image in which the heat map image is superimposed on a captured image of target device Tg1 acquired by camera 13, and displays the composite image on monitor 14. Terminal device 1 is configured to include communicator 10, processor 11, memory 12, camera 13, and monitor 14.

Here, target device Tg1 indicates an electrical/electronic device that is selected by a user and of which the electromagnetic wave intensity is measured. Target device Tg1 may be a device configured to include one or more conductors as generation sources of electromagnetic waves, and may be a conductor itself as a generation source of an electromagnetic wave. Target device Tg1 that is selected by the user and of which the electromagnetic wave intensity is measured may be one or a plurality.

Communicator 10 is communicatively connected by wire to signal processor 20 of measurement unit 2. Specifically, each of communicator 10 of terminal device 1 and signal processor 20 in measurement unit 2 has a Universal Serial Bus (USB) connector (not illustrated) and is connected by wire by using a USB cable (not illustrated). Communicator 10 outputs a measurement result of the electromagnetic wave intensity of target device Tg1 received from signal processor 20 to processor 11.

Communicator 10 may be wirelessly communicatively connected to signal processor 20. The wireless communication referred to here is communication via, for example, short-range wireless communication such as Bluetooth (registered trademark) or NFC (registered trademark), or a wireless local area network (LAN) such as Wifi (registered trademark).

Processor 11 as an example of a controller is configured by using, for example, a central processing unit (CPU), a digital signal processor (DSP), or a field programmable gate array (FPGA), and controls an operation of each unit of terminal device 1. Processor 11 functions as a controller of terminal device 1, and performs a control process for overall control of an operation of each unit of terminal device 1, a data input/output process with each unit of terminal device 1, a data calculation (computation) process, and a data storage process. Processor 11 operates according to a program and data stored in memory 12. When a trigger signal is input from camera 13, processor 11 starts measuring the electromagnetic wave intensity of target device Tg1.

Processor 11 detects a signal transmitted from measurement unit 2 attached to terminal device 1. Processor 11 detects (identifies) Identification (ID) information for each measurement unit that is set in advance and stored in memory 12 on the basis of the detected signal. Processor 11 reads various types of information stored in association with the detected (identified) ID information from memory 12. Here, the various types of information are frequency bandwidth information, wave impedance characteristics (refer to FIG. 4), and a correction coefficient table (refer to FIG. 5), which will be described later. The ID information of the measurement unit may be automatically detected (identified) by processor 11, or ID information of a measurement unit attached by the user may be input.

Processor 11 measures a measurement distance between terminal device 1 and target device Tg1 on the basis of the captured image acquired by camera 13. The measurement distance may be derived by camera 13. Processor 11 compares the measured measurement distance with an appropriate sensitivity distance of measurement unit 2, and determines whether or not the measurement distance is within the appropriate sensitivity distance of measurement unit 2. As a result of comparison, in a case where the measurement distance is shorter than the appropriate sensitivity distance of measurement unit 2 (that is, in a case where terminal device 1 is too close to target device Tg1 with respect to the appropriate sensitivity distance of measurement unit 2) processor 11 generates an alert for notifying that terminal device 1 is too close to the target device Tg1 and displays the alert on monitor 14.

Similarly, in a case where the measurement distance is longer than the appropriate sensitivity distance, processor 11 may generate an alert for notifying that terminal device 1 is far from target device Tg1 and display the alert on monitor 14. In such a case, a threshold value for determining whether or not the measurement distance is longer than the appropriate sensitivity distance may be set by the user, or may be calculated and set according to the wave impedance characteristics of the antenna.

The appropriate sensitivity distance referred to here indicates a measurement distance that is a so-called distant field in the wave impedance characteristics of each antenna of measurement unit 2. When the electromagnetic wave intensity is measured at a measurement distance in the distant field, terminal device 1 refers to correction coefficient table TB1 (refer to FIG. 5) for correcting a reception signal, and corrects the reception signal that has been received from measurement unit 2.

Figure 7:
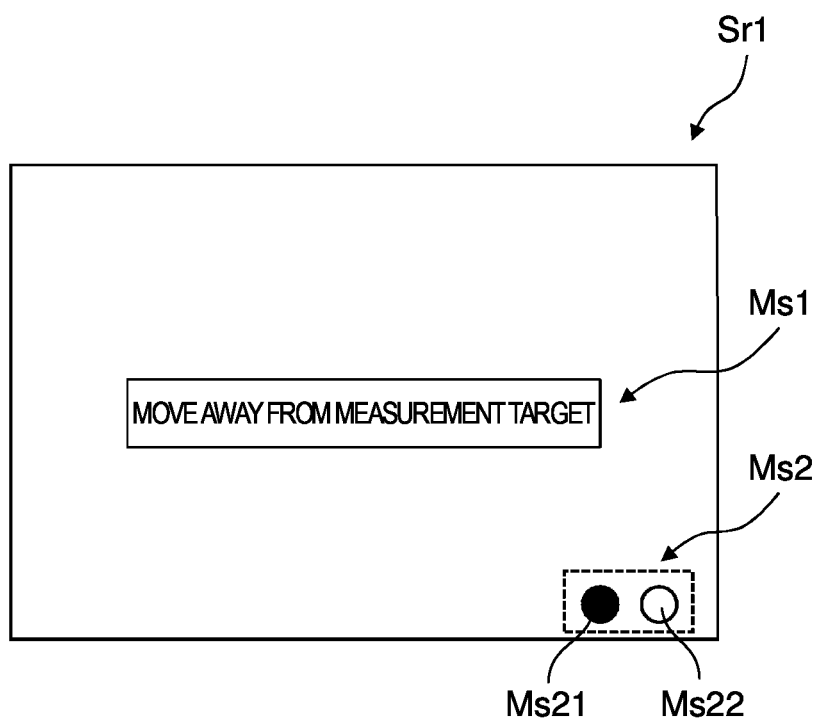
FIG. 7 is a diagram illustrating a display example of an alert notification.

The alert is, for example, a message or an indicator generated by processor 11 (refer to FIG. 7). The alert may be a voice output from a speaker (not illustrated).

In a case where the measurement distance is within the range of the appropriate sensitivity distance, processor 11 generates a heat map image on the basis of the measurement result of the electromagnetic wave intensity of target device Tg1 and generates a composite image in which the heat map image is superimposed on the captured image, and displays the composite image on monitor 14.

Memory 12 includes, for example, a random access memory (RAM) as a work memory used when each process of processor 11 is executed and a read only memory (ROM) that stores programs and data defining an operation of processor 11. Data or information generated or acquired by processor 11 is temporarily stored in the RAM. A program defining an operation of processor 11 is written in the ROM. Memory 12 stores identification (ID) information preset for each of the plurality of measurement units that can be attached to and detached from terminal device 1.

Memory 12 stores frequency bandwidth information that can be measured by measurement unit 2, wave impedance characteristics with respect to a measurement distance, and the correction coefficient table (refer to FIG. 5) for correcting a signal according to the frequency bandwidth information of measurement unit 2 and the measurement distance in association with the ID information.

Camera 13 as an example of an image acquisition unit and a distance measuring unit includes at least a lens (not illustrated) and an image sensor (not illustrated). The image sensor is, for example, a solid-state imaging sensor such as a charged-coupled device (CCD) or a complementary metal oxide semiconductor (CMOS), and converts an optical image formed on an imaging surface into an electric signal. When the user selects one or more target devices Tg1 from one or more target devices captured in an imaging region, camera 13 generates a trigger signal for starting measurement of the electromagnetic wave intensity generated during the operation of target device Tg1, and outputs the trigger signal to processor 11. In a case where target device Tg1 is not selected, camera 13 may generate a trigger signal for starting measurement of the electromagnetic wave intensity generated during an operation of target device Tg1 with the start of imaging as a trigger. Camera 13 acquires a captured image of target device Tg1 and outputs the acquired captured image to processor 11.

Camera 13 may be a separate body (that is, another camera connected externally and installed to be able to image target device Tg1) instead of being integrated with terminal device 1.

Monitor 14 as an example of an output unit is configured by using, for example, a liquid crystal display (LCD) or an organic electroluminescence (EL), and displays a captured image acquired by camera 13 or a composite image in which a heat map image (that is, a measurement result of the electromagnetic wave intensity) is superimposed on the captured image.

Monitor 14 may be a touch interface provided in terminal device 1 and configured with a touch panel. Monitor 14 accepts an input operation of the user.

Measurement unit 2 receives an electromagnetic wave generated from the target device in operation and measures the electromagnetic wave intensity. Measurement unit 2 is configured to be able to receive electromagnetic waves in different frequency bandwidths, and is detachably attached to a surface provided with camera 13. Measurement unit 2 illustrated in FIG. 2 indicates a state in which one of a plurality of antenna devices corresponding to the electromagnetic wave intensity in a predetermined frequency bandwidth is attached, and a structure for attaching and detaching the measurement unit 2 is not illustrated.

Measurement unit 2 is attached to terminal device 1 by the user according to a frequency bandwidth generated from the target device that is a measurement target. The frequency bandwidth that can be measured by using the plurality of measurement units according to Exemplary Embodiment 1 is a frequency bandwidth of 9 kHz to 6 GHz according to the EMC standard.

Measurement unit 2 illustrated in FIG. 1 has substantially the same size (area) as that of terminal device 1 except for the periphery of camera 13, but needless to say, a size and a shape of measurement unit 2 are not limited to the example illustrated in FIG. 1. The size of measurement unit 2 may be larger or smaller than that of monitor 14, for example. A shape of measurement unit 2 may be, for example, a rectangular shape. Measurement unit 2 includes signal processor 20, sensor 30, and ID storage unit 40.

Signal processor 20 performs conversion into a signal indicating the electromagnetic wave intensity generated from the target device on the basis of a reception signal intensity that has been received by sensor 30. Signal processor 20 has a USB connector, associates the converted signal with coordinate information on sensor 30, and transmits the measurement result of the electromagnetic wave intensity of target device Tg1 to communicator 10 of terminal device 1 via a USB cable connected therebetween. Signal processor 20 may transmit the measurement result to terminal device 1 by using short-range wireless communication or wireless LAN communication such as Wifi (registered trademark). The short-range wireless communication referred to here is, for example, Bluetooth (registered trademark) or NFC (registered trademark).

Sensor 30 has, for example, a dipole antenna or one or a plurality of loop antennas, and is configured to receive electromagnetic waves in a predetermined frequency bandwidth. Sensor 30 may be formed as a planar antenna. Sensor 30 outputs a reception signal that has received the electromagnetic wave generated from target device Tg1 to signal processor 20.

ID storage unit 40 is configured with, for example, a ROM, and stores the ID information of the measurement unit. ID storage unit 40 is not limited to storing the ID information, and may store information for identifying attached measurement unit 2, such as a serial number.

Figure 3:
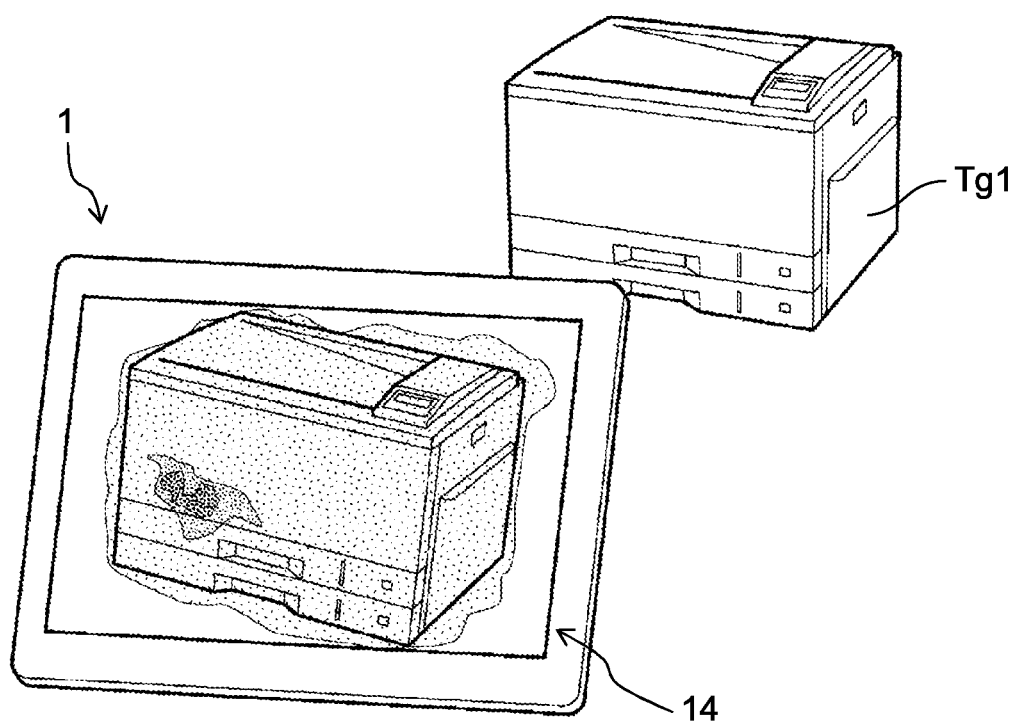
FIG. 3 is a diagram illustrating an example of a use case of the electromagnetic wave visualization device according to Exemplary Embodiment 1.

FIG. 3 is a diagram illustrating an example of a use case of electromagnetic wave visualization device 100 according to Exemplary Embodiment 1. Electromagnetic wave visualization device 100 is grasped by the user or placed on a desk or the like to measure the electromagnetic wave intensity generated from target device Tg1.

Electromagnetic wave visualization device 100 images target device Tg1 with camera 13 provided on the surface opposite to monitor 14, and also measures electromagnetic wave intensity generated from target device Tg1 in operation with measurement unit 2 attached to the surface opposite to monitor 14. Processor 11 generates a heat map image on the basis of the measurement result of the electromagnetic wave intensity, generates a composite image in which the heat map image is superimposed on the captured image, and displays the composite image on monitor 14. Although the measurement result of the electromagnetic wave intensity of target device Tg1 is displayed as the heat map image in FIG. 3, a method of displaying the measurement result is not limited to this, and may be, for example, a numerical value.

Consequently, electromagnetic wave visualization device 100 according to Exemplary Embodiment 1 can easily visualize an intensity of an electromagnetic wave generated during an operation of target device Tg1 in the operation environment thereof, without taking out a predetermined conductor that is a generation source of the electromagnetic wave.

Figure 4:
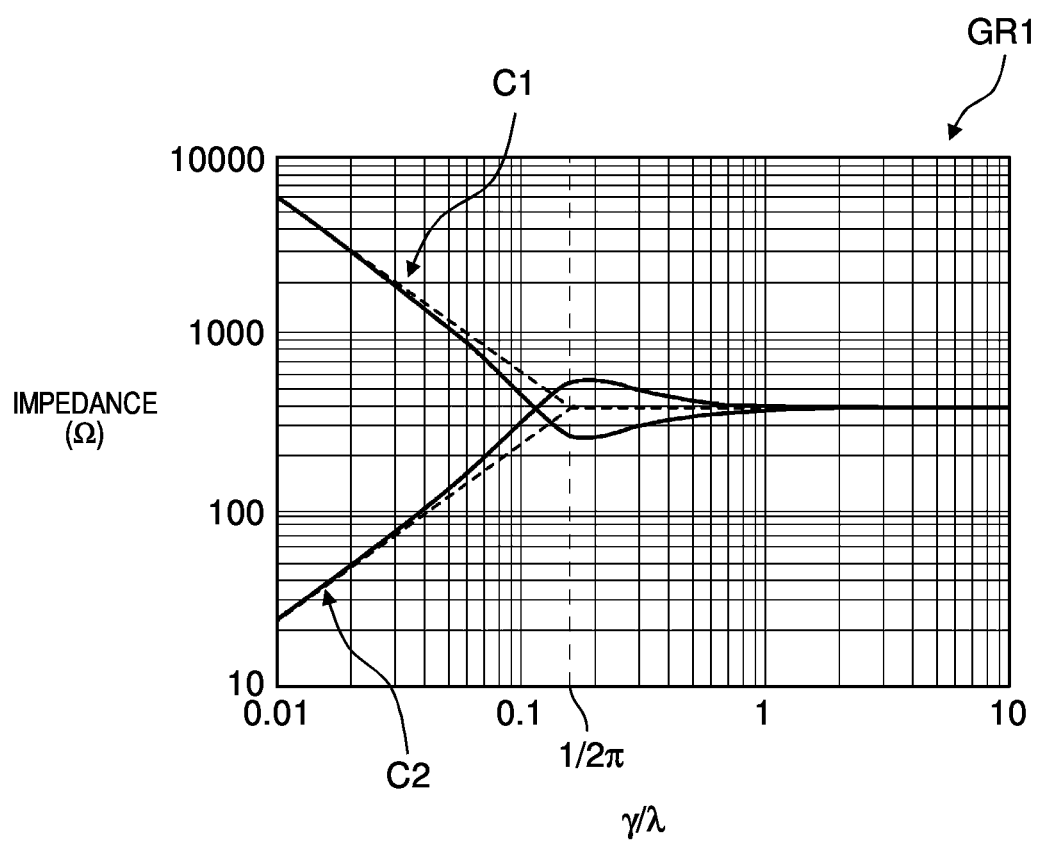
FIG. 4 is a graph illustrating an example of a relationship between a measurement distance and a wave impedance characteristics.
Figure 5:
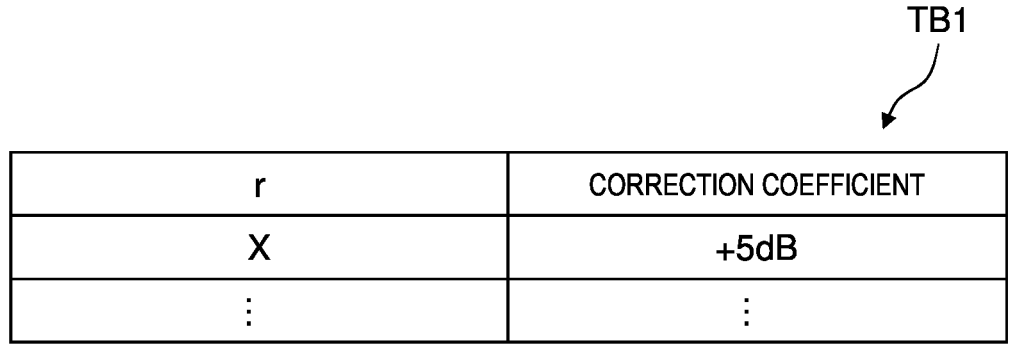
FIG. 5 is a diagram illustrating an example of a correction coefficient table indicating an example of a correspondence relationship between a measurement distance and a correction coefficient of reception intensity.

Wave impedance characteristics C1 of a loop antenna and wave impedance characteristics C2 of a dipole antenna will be described with reference to FIGS. 4 and 5. FIG. 4 is graph GR1 illustrating an example of a relationship between measurement distance r and wave impedance characteristics C1 and C2. FIG. 5 is a diagram illustrating an example of correction coefficient table TB1 indicating an example of a correspondence relationship between a measurement distance and a correction coefficient of a reception intensity.

Graph GR1 of FIG. 4 is a diagram illustrating a relationship between measurement distance r between measurement unit 2 and target device Tg1 and the wave impedance (that is, the impedance of the space with respect to the electromagnetic wave). A horizontal axis (A) of graph GR1 expresses a value obtained by dividing measurement distance r by wavelength $\lambda$ of the electromagnetic wave generated from target device Tg1. Each of wave impedance characteristics C1 of the loop antenna and wave impedance characteristics C2 of the dipole antenna shows a so-called near field in the region of $r/\lambda < 1/2\pi$. In such an electromagnetic wave in the near field, strengths of the electric field and the magnetic field are different (for example, in the loop antenna, the impedance is low because the magnetic field strength is dominant, and in the dipole antenna, the impedance is high because the electric field strength is dominant), and a wavefront is required to be regarded as a spherical surface, so that it is difficult to perform highly accurate intensity measurement. Therefore, in a case where measurement distance r is in a region of the near field, terminal device 1 executes measurement of the electromagnetic wave intensity according to the wave impedance characteristics in the near field. Specifically, terminal device 1 corrects the reception signal on the basis of correction coefficient table TB1 according to the frequency bandwidth information (that is, frequency) of the attached measurement unit, and acquires a measurement result of the electromagnetic wave intensity on the basis of the corrected reception signal.

In a case where the frequency bandwidth information (that is, frequency) of the attached measurement unit is a frequency that is easy to measure in a region where measurement distance r is a distant field (for example, a frequency of 70 MHz or higher showing a distant field at measurement distance r of 1 m), terminal device 1 generates an alert indicating that the reception signal has been corrected and for giving an instruction for measurement away from target device Tg1 and displays the alert on monitor 14.

On the other hand, in a case where the frequency bandwidth information (that is, frequency) of the attached measurement unit is a frequency that is not easy to measure in a region where measurement distance r is a distant field and is easy to measure in a region where measurement distance r is a near field (for example, a frequency of 50 MHz or less that does not show a distant field even if measurement distance r is 1 m), terminal device 1 generates an alert for notifying that the reception signal has been corrected and displays the alert on monitor 14.

Needless to say, a frequency that is easy to measure in the region of the distant field and a frequency that is measured in the region where measurement distance r is the near field are not limited to these. A frequency that is easy to measure in the region of the distant field and a frequency that is measured in the region where measurement distance r is the near field may be changed as appropriate according to a size of sensor 30, an angle of view of camera 13, and a size of a room where the electromagnetic wave intensity is measured, a size of target device Tg1, or the like. Consequently, electromagnetic wave visualization device 100 can measure the electromagnetic wave intensity according to a measurement environment.

Each of wave impedance characteristics C1 of the loop antenna and wave impedance characteristics C2 of the dipole antenna shows a so-called distant field in the region of $r/\lambda > 1/2\pi$. In an electromagnetic wave in the distant field, a ratio of strengths of the electric field and the magnetic field is equal, the wavefront can be regarded as a plane (wave), and the impedance approaches a predetermined value, so that the intensity measurement is easy. Therefore, in a case where measurement distance r is in the region of the distant field, terminal device 1 executes the measurement of the electromagnetic wave intensity according to the wave impedance characteristics in the distant field. Specifically, terminal device 1 corrects the reception signal on the basis of correction coefficient table TB1 according to the frequency bandwidth information (that is, frequency) of the attached measurement unit, and acquires a measurement result of the electromagnetic wave intensity on the basis of the corrected reception signal.

In a case where the received electromagnetic wave intensity is small due to factors such as long measurement distance r and a small electromagnetic wave intensity generated from target device Tg1, terminal device 1 may perform gain adjustment and correction.

Terminal device 1 generates a heat map image on the basis of the corrected reception signal intensity, generates a composite image in which the heat map image is superimposed on the captured image, and displays the composite image on monitor 14. In a case where the reception signal is corrected on the basis of correction coefficient table TB1, or in a case where a gain is adjusted and corrected, terminal device 1 generates an alert for notifying that the reception signal has been corrected and displays the alert on monitor 14.

As illustrated in FIG. 5, correction coefficient table TB1 stores a correction coefficient and measurement distance r in correlation with each other. Terminal device 1 executes correction on the measurement result of the electromagnetic wave intensity on the basis of correction coefficient table TB1 stored in memory 12 and measurement distance r. For example, in a case where the electromagnetic wave is measured when measurement distance r is X, terminal device 1 executes correction of +5 dB on the measurement result of the electromagnetic wave intensity. Terminal device 1 generates a heat map image on the basis of a measurement result indicated by the corrected electromagnetic wave intensity, generates a composite image in which the generated heat map image is superimposed on the captured image, and displays the composite image on monitor 14.

Figure 6:
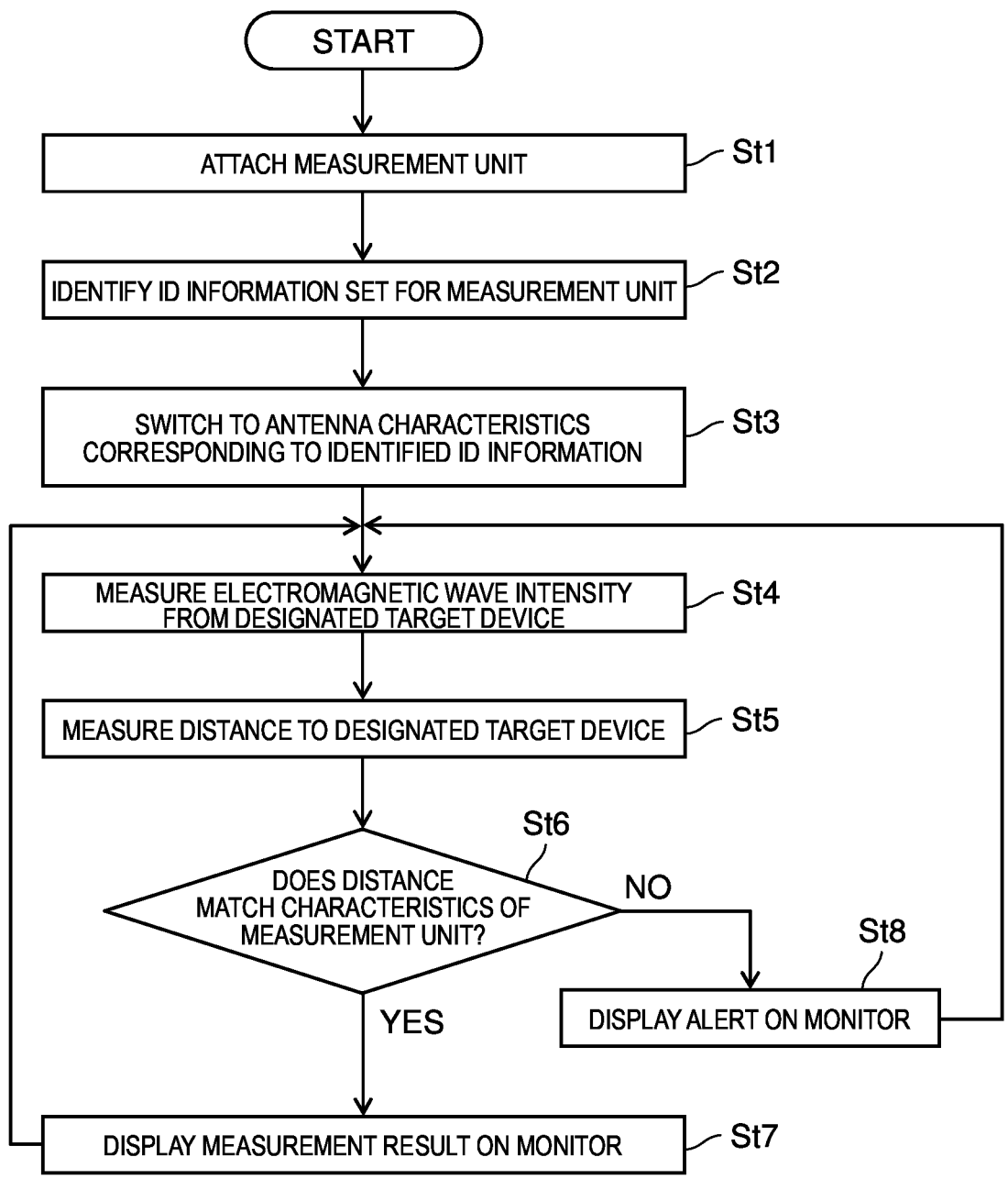
FIG. 6 is a flowchart illustrating an example of an operation procedure of the electromagnetic wave visualization device according to Exemplary Embodiment 1.

FIG. 6 is a flowchart illustrating an operation procedure example of electromagnetic wave visualization device 100 according to Exemplary Embodiment 1.

The user attaches measurement unit 2 corresponding to a frequency bandwidth of an electromagnetic wave emitted by a measurement device to terminal device 1. Terminal device 1 detects that measurement unit 2 is attached on the basis of a signal emitted by measurement unit 2 (SW.

Terminal device 1 identifies (detects) ID information set for the attached measurement unit 2 on the basis of the signal emitted by measurement unit 2 (St2). The ID information is an example of information for identifying measurement unit 2, and is not limited to this, and may be, for example, a serial number.

On the basis of the identified ID information, terminal device 1 reads various types of information (for example, frequency bandwidth information that can be measurable by the measurement unit, wave impedance characteristics with respect to a measurement distance, and a correction coefficient table according to the measurement distance) stored in memory 12 in association with the ID information of each of a plurality of measurement units. Terminal device 1 switches the previously used settings for electromagnetic wave measurement and composite image generation of the measurement unit to antenna characteristic settings of measurement unit 2 corresponding to the various types of information of (St3).

Terminal device 1 displays a captured image acquired by camera 13 on monitor 14. Terminal device 1 sets one target device Tg1 designated (selected) by the user among one or more target devices captured in the captured image as a target of which an electromagnetic wave is measured, and starts measuring an electromagnetic wave generated during an operation of target device Tg1. Terminal device 1 receives an electromagnetic wave reception signal from measurement unit 2 and measures the electromagnetic wave intensity of target device Tg1 (St4).

Terminal device 1 measures a distance (that is, a measurement distance) from the designated (selected) target device Tg1 on the basis of the captured image from camera 13 (St5).

Terminal device 1 determines whether or not the measurement distance is an appropriate sensitivity distance based on the wave impedance characteristics of measurement unit 2 (St6). The appropriate sensitivity distance is calculated on the basis of a measurement distance to target device Tg1 and a frequency of the electromagnetic wave received from target device Tg1. Terminal device 1 sets measurement distance r that satisfies $r/\lambda > 1/2\pi$ as the appropriate sensitivity distance according to the frequency bandwidth information of the attached measurement unit 2.

In a case where it is determined in the process in step St6 that the measurement distance is the appropriate sensitivity distance (St6, YES), terminal device 1 corrects a reception signal based on correction coefficient table TB1. Terminal device 1 generates a heat map image on the basis of the corrected reception signal intensity, generates a composite image in which the heat map image is superimposed on the captured image, and displays the composite image on monitor 14 (St7).

When it is determined in the process in step St6 that the measurement distance is not the appropriate sensitivity distance (St6, NO), terminal device 1 generates an alert for giving an instruction for measurement away from target device Tg1 without correcting the reception signal, and displays the alert on monitor 14 (St8).

Terminal device 1 executes the processes in step St7 and step St8, and then returns to the process in step St4.

In the process in step St3 in the operation procedure example of electromagnetic wave visualization device 100 described above, a case of, on the basis of the frequency bandwidth information indicated by the detected ID information, a frequency that is easy to measure in a region of a near field (for example, a frequency of 50 MHz or less that does not show a distant field even if measurement distance r is 1 m) will be described. In such a case, terminal device 1 determines in the process in step St6 that the measurement distance is not the appropriate sensitivity distance (St6, NO), and executes correction on the reception signal according to a characteristic in the near field among the wave impedance characteristics of the antenna of measurement unit 2. Terminal device 1 generates a heat map image on the basis of the corrected reception signal intensity, and generates a composite image in which the heat map image is superimposed on the captured image. Terminal device 1 generates an alert for giving an instruction for measurement away from target device Tg1 and an alert for notifying that the reception signal has been corrected, and outputs and displays the composite image and the alerts on monitor 14. As described above, electromagnetic wave visualization device 100 according to Exemplary Embodiment 1 can easily visualize the intensity of an electromagnetic wave generated during an operation of target device Tg1.

FIG. 7 is a diagram illustrating a display example of an alert notification. Each of plurality of alerts Ms1 and Ms2 illustrated in FIG. 7 is generated by terminal device 1 in a case where a measurement distance to target device Tg1 is in the region of the near field (that is, $r/\lambda > 1/2\pi$), and is displayed on screen Sr1 (that is, monitor 14). Although plurality of alerts Ms1 and Ms2 are displayed on screen Sr1 illustrated in FIG. 7, only one of the alerts may be displayed.

Alert Ms1 is a message "move away from the measurement target" indicating that target device Tg1 is separated. The measurement target referred to here indicates target device Tg1. Alert Ms1 may be output in voice from a speaker (not illustrated).

Alert Ms1 is not limited to the above example. Alert Ms1 may be a message indicating that the reception signal has been corrected in a case where the reception signal has been corrected on the basis of correction coefficient table TB1 or in a case where a gain has been adjusted and corrected. Specifically, in a case of a frequency that is easy to measure in the region of the near field (for example, a frequency of 50 MHz or less that does not show a distant field even if measurement distance r is 1 m), an alert including a message indicating that target device Tg1 is separated and a message indicating that the reception signal has been corrected is displayed.

Alert Ms2 includes plurality of indicators Ms21 and Ms22, and notifies the user whether or not the measurement distance is an appropriate sensitivity distance with a lighting location of the indicator or a change in color. Alert Ms2 may be a single indicator.

Electromagnetic wave visualization device 100 according to Exemplary Embodiment 1 has been described above, but the present invention is not limited to this. Hereinafter, other examples of each constituent in Exemplary Embodiment 1 will be described.

A frequency bandwidth that can be measured by each of the plurality of measurement units used in electromagnetic wave visualization device 100 is not limited to the frequency bandwidth of 9 kHz to 6 GHz according to the EMC standard. For example, a measurement unit that can be used in electromagnetic wave visualization device 100 may be capable of measuring millimeter waves. Consequently, electromagnetic wave visualization device 100 can evaluate a directivity and a radio wave intensity of a wireless communication device.

Monitor 14 used in electromagnetic wave visualization device 100 may be provided separately from terminal device 1. Monitor 14 may be implemented by, for example, another monitor or a head mounted display (HMD) communicatively connected to terminal device 1 in a wired or wireless manner. Monitor 14 displays a composite image (that is, a measurement result) that is output to the outside from processor 11 of terminal device 1.

Camera 13 used in electromagnetic wave visualization device 100 may be provided separately from terminal device 1. Camera 13 is communicatively connected to, for example, terminal device 1, and images target device Tg1 from a predetermined position.

In a case where camera 13 and monitor 14 are externally and communicatively connected to terminal device 1 in a wired or wireless manner, terminal device 1 may receive a captured image from camera 13 and transmit a composite image as a measurement result to monitor 14. Specifically, terminal device 1 generates a composite image in which a measurement result of the electromagnetic wave intensity generated from target device Tg1 received by sensor 30 is superimposed on the captured image received from camera 13, and transmits the composite image to monitor 14. Monitor 14 displays the received composite image.

As described above, electromagnetic wave visualization device 100 according to Exemplary Embodiment 1 includes an image acquisition unit (camera 13) that captures an image of target device Tg1; measurement unit 2 that measures an electromagnetic wave intensity of target device Tg1; a controller (processor 11) that generates a composite image in which a measurement result (that is, a heat map image) of the electromagnetic wave intensity measured by measurement unit 2 is superimposed on the captured image of target device Tg1 acquired by the image acquisition unit; an output unit (monitor 14) that displays the composite image generated by the controller; and a distance measuring unit (camera 13) that measures a distance from measurement unit 2 to target device Tg1 (that is, a measurement distance r), in which the controller determines, on the basis of a frequency bandwidth that is measurable by measurement unit 2 in a region of a distant field, whether or not the distance measured by the distance measuring unit is within a predetermined distance (that is, an appropriate sensitivity distance) at which the electromagnetic wave intensity in the frequency bandwidth is measurable, and generates an alert indicating that it is difficult to measure the electromagnetic wave intensity in a case where the distance is not within the predetermined distance, and causes the output unit to output the alert.

Consequently, electromagnetic wave visualization device 100 according to Exemplary Embodiment 1 can easily visualize the intensity of an electromagnetic wave generated during an operation of target device Tg1. Electromagnetic wave visualization device 100 can determine whether or not a distance matches characteristics of measurement unit 2, and can notify a user in a case where the distance does not match the characteristics.

In electromagnetic wave visualization device 100 according to Exemplary Embodiment 1, one of a plurality of measurement units capable of measuring an electromagnetic wave intensity in each of different frequency bandwidths is detachably disposed as measurement unit 2. Consequently, a user can adaptively use the measurement unit according to a frequency of an electromagnetic wave generated during an operation of target device Tg1. By restricting the frequency bandwidth that can be measured by measurement unit 2, a manufacturing cost of the measurement unit can be reduced.

The controller of electromagnetic wave visualization device 100 according to Exemplary Embodiment 1 detects ID information stored in measurement unit 2 and calculates a predetermined distance (that is, an appropriate sensitivity distance) on the basis of the ID information. Consequently, electromagnetic wave visualization device 100 according to Exemplary Embodiment 1 does not require an input operation by a user, and can acquire the predetermined distance according to an electromagnetic wave intensity in a frequency bandwidth that can be measured by measurement unit 2 on the basis of the ID information stored in measurement unit 2.

Target device Tg1 in electromagnetic wave visualization device 100 according to Exemplary Embodiment 1 has at least one conductor as a generation source of an electromagnetic wave. Consequently, electromagnetic wave visualization device 100 according to Exemplary Embodiment 1 can easily visualize an intensity of an electromagnetic wave generated during an operation of target device Tg1 in the operation environment thereof, without taking out a predetermined conductor that is a generation source of the electromagnetic wave.

Measurement unit 2 of electromagnetic wave visualization device 100 according to Exemplary Embodiment 1 is configured to have at least one dipole antenna. Consequently, electromagnetic wave visualization device 100 according to Exemplary Embodiment 1 can obtain the measurement sensitivity to the electric field and can reduce the manufacturing cost of measurement unit 2 due to the simple structure.

Measurement unit 2 of electromagnetic wave visualization device 100 according to Exemplary Embodiment 1 is configured to have at least one loop antenna. Consequently, electromagnetic wave visualization device 100 according to Exemplary Embodiment 1 can obtain the measurement sensitivity to the magnetic field.

Measurement unit 2 of electromagnetic wave visualization device 100 according to Exemplary Embodiment 1 is detachably disposed on a surface provided with an image acquisition unit. Consequently, electromagnetic wave visualization device 100 according to Exemplary Embodiment 1 can simultaneously measure an intensity of an electromagnetic wave of target device Tg1 and image target device Tg1, and can thus easily visualize the intensity of the electromagnetic wave on the basis of a generated composite image.

The controller of electromagnetic wave visualization device 100 according to Exemplary Embodiment 1 starts measuring an electromagnetic wave intensity of at least one target device Tg1 selected on the basis of a user's selection operation among one or more devices captured in a captured image acquired by the image acquisition unit, superimposes a measurement result of the electromagnetic wave intensity related to target device Tg1 (that is, a heat map image) on a composite image, and outputs the composite image to the output unit. Consequently, electromagnetic wave visualization device 100 according to Exemplary Embodiment 1 can restrict the number of measurement devices even in a case where there are a plurality of devices that can be target devices captured in a captured image. Consequently, a user can restrict a target device to be measured, and can easily check an intensity of an electromagnetic wave related to selected target device Tg1.

Measurement unit 2 of electromagnetic wave visualization device 100 according to Exemplary Embodiment 1 can measure an electromagnetic wave intensity in a predetermined frequency bandwidth. Consequently, a user can restrict an electromagnetic wave intensity from the viewpoint of a frequency of an electromagnetic wave generated during an operation of target device Tg1 to be measured.

Electromagnetic wave visualization device 100 according to Exemplary Embodiment 1 includes camera 13 that captures an image of target device Tg1; measurement unit 2 that measures an electromagnetic wave intensity of target device Tg1; a controller that generates a composite image in which a measurement result of the electromagnetic wave intensity measured by measurement unit 2 is superimposed on the captured image of target device Tg1 acquired by camera 13; monitor 14 that displays the composite image generated by the controller; and a distance measuring unit that measures a distance from measurement unit 2 to target device Tg1. The controller determines, on the basis of a frequency bandwidth that is measurable by measurement unit 2, whether or not the distance measured by the distance measuring unit is within a predetermined distance at which the electromagnetic wave intensity in the frequency bandwidth is measurable, generates an alert in a case where the distance is not within the predetermined distance, and causes monitor 14 to output the alert. Consequently, electromagnetic wave visualization device 100 according to Exemplary Embodiment 1 can easily visualize the intensity of an electromagnetic wave generated during an operation of target device Tg1.

Although various exemplary embodiments have been described above with reference to the accompanying drawings, the present disclosure is not limited to such examples. It is obvious that a person skilled in the art can conceive of various changes, modifications, replacements, additions, deletions, and equivalents within the category disclosed in the claims, and it is understood that they fall within the technical scope of the present disclosure. The respective constituents in the various exemplary embodiments described above may be freely combined within the scope without departing from the concept of the invention.

INDUSTRIAL APPLICABILITY

The present disclosure is useful as an electromagnetic wave visualization device that easily visualizes an intensity of an electromagnetic wave generated during an operation of a target device.

REFERENCE MARKS IN THE DRAWINGS

1 Terminal device
2 Measurement unit
10 Communicator
11 Processor
12 Memory
13 Camera
14 Monitor
20 Signal processor
30 Sensor
40 ID storage unit
100 Electromagnetic wave visualization device
Tg1 Target device
Ms1, Ms2 Alert
r Measurement distance

The invention claimed is:
1. An electromagnetic wave visualization device comprising:
an image acquisition unit that captures an image of a target device;
a measurement unit that measures an electromagnetic wave intensity of the target device;
a controller that generates a composite image in which a measurement result of the electromagnetic wave intensity measured by the measurement unit is superimposed on the captured image of the target device acquired by the image acquisition unit;
an output unit that outputs the composite image generated by the controller; and
a distance measuring unit that measures a distance from the measurement unit to the target device,
wherein the controller determines, on the basis of a frequency bandwidth that is measurable by the measurement unit, whether or not the distance measured by the distance measuring unit is within a predetermined distance at which the electromagnetic wave intensity in the frequency bandwidth is measurable, generates an alert indicating that the distance is not an appropriate sensitivity distance in a case where the distance is not within the predetermined distance, and causes the output unit to output the alert.

2. The electromagnetic wave visualization device according to claim 1, wherein as the measurement unit, any one of a plurality of measurement units capable of measuring the electromagnetic wave intensity in each of different frequency bandwidths is detachably disposed.

3. The electromagnetic wave visualization device according to claim 1, wherein the controller detects ID information stored in the measurement unit, acquires the measurable frequency bandwidth on the basis of the ID information, and calculates the predetermined distance.

4. The electromagnetic wave visualization device according to claim 1, wherein the target device has at least one conductor as a generation source of an electromagnetic wave.

5. The electromagnetic wave visualization device according to claim 1, wherein the measurement unit is configured to have at least one dipole antenna.

6. The electromagnetic wave visualization device according to claim 1, wherein the measurement unit is configured to have at least one loop antenna.

7. The electromagnetic wave visualization device according to claim 1, wherein the measurement unit is detachably disposed on a surface provided with the image acquisition unit.

8. The electromagnetic wave visualization device according to claim 1, wherein the controller starts measuring the electromagnetic wave intensity with, as the target device, at least one device selected on the basis of a user's selection operation among one or more devices captured in the captured image acquired by the image acquisition unit, superimposes a measurement result of the electromagnetic wave intensity related to the target device on the composite image, and outputs the composite image to the output unit.

9. The electromagnetic wave visualization device according to claim 1, wherein the measurement unit is able to measure the electromagnetic wave intensity in a predetermined frequency bandwidth.

10. An electromagnetic wave visualization device comprising:
   a camera that captures an image of a target device;
   a measurement unit that measures an electromagnetic wave intensity of the target device;
   a controller that generates a composite image in which a measurement result of the electromagnetic wave intensity measured by the measurement unit is superimposed on the captured image of the target device acquired by the camera;
   a monitor that displays the composite image generated by the controller; and
   a distance measuring unit that measures a distance from the measurement unit to the target device,
   wherein the controller determines, on the basis of a frequency bandwidth that is measurable by the measurement unit, whether or not the distance measured by the distance measuring unit is within a predetermined distance at which the electromagnetic wave intensity in the frequency bandwidth is measurable, generates an alert indicating that the distance is not an appropriate sensitivity distance in a case where the distance is not within the predetermined distance, and causes the monitor to output the alert.

* * * * *